(12) United States Patent
Sekine et al.

(10) Patent No.: US 9,806,123 B2
(45) Date of Patent: Oct. 31, 2017

(54) IMAGE SENSOR AND MANUFACTURING METHOD THEREOF

(71) Applicant: NLT Technologies, Ltd., Kawasaki, Kanagawa (JP)

(72) Inventors: Hiroyuki Sekine, Kawasaki (JP); Takayuki Ishino, Kawasaki (JP); Toru Ukita, Kawasaki (JP); Fuminori Tamura, Kawasaki (JP); Kazushige Takechi, Kawasaki (JP)

(73) Assignee: NLT TECHNOLOGIES, LTD., Kawasaki, Kanagawa (JP)

( * ) Notice: Subject to any disclaimer, the term of this patent is extended or adjusted under 35 U.S.C. 154(b) by 0 days.

(21) Appl. No.: 15/189,252

(22) Filed: Jun. 22, 2016

(65) Prior Publication Data

US 2016/0293659 A1 Oct. 6, 2016

Related U.S. Application Data

(62) Division of application No. 14/529,340, filed on Oct. 31, 2014, now Pat. No. 9,401,382.

(30) Foreign Application Priority Data

Nov. 7, 2013 (JP) .................................. 2013-231151

(51) Int. Cl.
*H01L 29/12* (2006.01)
*H01L 27/146* (2006.01)
(Continued)

(52) U.S. Cl.
CPC .... *H01L 27/14658* (2013.01); *H01L 27/1225* (2013.01); *H01L 27/1462* (2013.01);
(Continued)

(58) Field of Classification Search
CPC ......... H01L 27/14663; H01L 27/14612; H01L 27/14692; H01L 27/14609;
(Continued)

(56) References Cited

U.S. PATENT DOCUMENTS 4,740,824 A 4/1988 Yano et al.
5,343,061 A * 8/1994 Yamashita ........ H01L 27/14893
257/223

(Continued)

FOREIGN PATENT DOCUMENTS

JP 62-086855 A 4/1987
JP 04-206573 A 7/1992
(Continued)

OTHER PUBLICATIONS

Communication dated Jun. 13, 2017 from the Japanese Patent Office in counterpart application No. 2013-231151.

*Primary Examiner* — Thinh T Nguyen
(74) *Attorney, Agent, or Firm* — Sughrue Mion, PLLC

(57) ABSTRACT

Provided are an image sensor and a method of manufacturing method of manufacturing the image sensor. The image sensor includes a substrate, photoelectric transducers and switching elements formed in layers on the substrate in this order. Each of the photoelectric transducers includes a hydrogenated amorphous silicon layer. Each of the switching elements includes an amorphous oxide semiconductor layer. The image sensor further includes a blocking layer arranged between the hydrogenated amorphous silicon layers of the photoelectric transducers and the amorphous oxide semiconductor layers of the switching elements, where the blocking layer suppresses penetration of hydrogen separated from the hydrogenated amorphous silicon layers.

3 Claims, 8 Drawing Sheets

(51) Int. Cl.
| | |
|---|---|
| *H01L 29/66* | (2006.01) |
| *H01L 29/786* | (2006.01) |
| *H01L 31/028* | (2006.01) |
| *H01L 31/20* | (2006.01) |
| *H01L 31/0232* | (2014.01) |
| *H01L 27/12* | (2006.01) |
| *H01L 31/0376* | (2006.01) |
| *H01L 27/30* | (2006.01) |
| *H01L 27/32* | (2006.01) |

(52) U.S. Cl.
CPC .. *H01L 27/14612* (2013.01); *H01L 27/14663* (2013.01); *H01L 27/14685* (2013.01); *H01L 27/14692* (2013.01); *H01L 29/66969* (2013.01); *H01L 29/78606* (2013.01); *H01L 29/78693* (2013.01); *H01L 31/028* (2013.01); *H01L 31/02322* (2013.01); *H01L 31/03762* (2013.01); *H01L 31/204* (2013.01); *H01L 27/14609* (2013.01); *H01L 27/14643* (2013.01); *H01L 27/307* (2013.01); *H01L 27/3234* (2013.01)

(58) Field of Classification Search
CPC ......... H01L 27/14603; H01L 27/14643; H01L 29/66969; H01L 29/78693; H01L 31/028; H01L 31/204; H01L 31/02322
USPC .......... 257/43, 225, 226, 291–294, E27.133; 438/48, 49, 54
See application file for complete search history.

(56) References Cited

U.S. PATENT DOCUMENTS

| | | |
|---|---|---|
| 7,391,066 B2 | 6/2008 | Rhodes |
| 2002/0056810 A1 | 5/2002 | Kobayashi et al. |
| 2009/0027372 A1* | 1/2009 | Shishido .................. G01J 1/02 345/207 |
| 2011/0049518 A1* | 3/2011 | Noda ................ H01L 29/78606 257/57 |
| 2012/0002090 A1 | 1/2012 | Aoki et al. |
| 2012/0153173 A1 | 6/2012 | Chang et al. |
| 2012/0193544 A1 | 8/2012 | Kaneko et al. |
| 2012/0280234 A1 | 11/2012 | Koezuka et al. |
| 2013/0170616 A1* | 7/2013 | Mruthyunjaya .. H01L 27/14663 378/62 |
| 2013/0203214 A1 | 8/2013 | Isobe et al. |
| 2013/0214279 A1 | 8/2013 | Nishimura et al. |
| 2013/0292572 A1* | 11/2013 | Kaneko ................ A61B 6/4208 250/361 R |
| 2013/0334523 A1* | 12/2013 | Yamazaki ......... H01L 29/78693 257/43 |
| 2014/0009199 A1 | 1/2014 | Ohmaru et al. |

FOREIGN PATENT DOCUMENTS

| | | |
|---|---|---|
| JP | 06-342078 A | 12/1994 |
| JP | 11-307756 A | 11/1999 |
| JP | 2008-042088 A | 2/2008 |
| JP | 2008-060419 A | 3/2008 |
| JP | 2008-270840 A | 11/2008 |
| JP | 2009-071057 A | 4/2009 |
| JP | 2010-16128 A | 1/2010 |
| JP | 2012-34354 A | 2/2012 |
| JP | 2012-159395 A | 8/2012 |
| JP | 2012-253329 A | 12/2012 |
| JP | 2013-179286 A | 9/2013 |
| WO | 2011/135908 A1 | 11/2011 |

* cited by examiner

IMAGE SENSOR AND MANUFACTURING METHOD THEREOF

CROSS REFERENCE TO RELATED APPLICATIONS

This application is a Divisional of U.S. patent application Ser. No. 14/529,340 filed Oct. 31, 2014, which claims priority to Japanese Patent Application No. 2013-231151, filed Nov. 7, 2013, the contents of all of which are incorporated herein by reference in their entirety.

TECHNICAL FIELD

The present invention relates to a structure of an image sensor and a manufacturing method thereof, in particular, to a structure of an image sensor for a radiographic imaging apparatus and a manufacturing method thereof.

BACKGROUND

Techniques for inspecting inside an inspection target in a non-destructive manner using X-ray transmission images have become essential techniques in various fields such as a field of medical services and a field of industrial-use non-destructive testing. Especially, X-ray image sensors which can directly capture X-ray transmission images as electronic data have become widely used because of their properties such as fast imaging, capability to assist in X-ray interpretation by using image processing, and capability to support moving images. Devices called an FPD (flat panel detector) are mainly used as such an X-ray image sensor.

Japanese Unexamined Patent Application Publication (JP-A) No. H04-206573 discloses a structure often used as the FPD (see FIG. 5 of the document) in these days. FIG. 13 depicts the structure, in which switching elements 700, photoelectric transducers 300 are arranged on substrate 200 in layers and a phosphor layer 600 for converting X-rays into light is further arranged on the layered structure with a passivation film 750 and a flattening film 760 inserted between the phosphor layer 600 and the layered structure. Each switching element 700 includes a gate electrode 710, a gate insulating film 720, an a-Si:H (hydrogenated amorphous silicon) film 730, and source and drain metals 740. Each photoelectric transducer 300 includes a lower electrode 310, an a-Si:H film 330 and an upper electrode 350. In the disclosed structure, electric signals according to the exposure intensities of X-rays are obtained by converting X rays which have passed through a specimen into light with the phosphor layer 600, converting the light into electric charges with the photoelectric transducers 300, and then outputting the electric charges from the structure by opening or closing the switching elements 700.

In FPDs widely used nowadays, a-Si:H TFTs are used as TFTs (thin-film transistors), which are switching elements, and a-Si:H photodiodes are used as photoelectric transducers. It should be noted that, although this example provides a structure that the switching elements, the photoelectric transducers and the phosphor layer are layered on the substrate in this order, FPDs can have another layered structure that a substrate, a phosphor layer, photoelectric transducers and switching elements are layered in this order as disclosed in FIG. 1 of JP-A No. H06-342078. In addition, there are FPDs employing a different technique for converting X-rays into electric signals, which do not use a phosphor layer. For example, JP-A No. S62-86855 (see FIG. 2 of the document) discloses a structure that uses a photoconductor layer which converts X-rays into the electric charges directly, and discloses a method that uses a layer of $Bi_{12}Ge_{20}$ as an example of the photoconductor layer. However, the direct type FPDs which convert X-rays into electric charges directly have a disadvantage of quantum efficiency being lower than the indirect type FPDs which use a phosphor layer. There are several types of FPD structure as described above. However, all of them have a structure in which at least switching elements and photoelectric transducers are formed in layers on a substrate.

During recent years, in the field of medical services, there are increasing demands on X-ray diagnosis devices to realize higher resolution and support fluoroscopy (taking moving or real-time images) on radiographic imaging. This is because higher resolution is essential for observing an affected part in more detail, and fluoroscopy is required for checking an optimal condition for radiographic imaging and finding out a proper timing for radiographic imaging. In order to increase the resolution of FPDs, there is a need to read signals at high speed from an increased number of photodetectors which have been prepared for realizing the high resolution. In order to support fluoroscopy, it is necessary to read the signals from all the photodetectors during a predetermined frame period. That is, it is necessity to read the signals at far more higher speed in order to allow an FPD having higher resolution to support fluoroscopy.

The main cause of the limitation of the signal read-out speed of FPDs is on-state resistance of the switching elements. In conventional FPDs, a-Si:H TFTs are used for the switching elements. The field-effect mobility of a-Si:H is as low as 1 $cm^2$/Vs or less. This causes high on-state resistance of the a-Si:H TFTs. Alternatively, there are poly-Si (polycrystalline silicon) TFTs, which are switching elements that can be formed on a large-sized substrate. The field-effect mobility of poly-Si is reported to have as high as more than 100 $cm^2$/Vs. Thus, the on-state resistance of the poly-Si TFTs is very small.

However, poly-Si TFTs have another problem that their threshold voltages vary largely. Such variations in threshold voltages cause variations in the signal electric charges in FPDs, causing FPN (fixed pattern noise). The FPN can be corrected by modifying a signal readout circuit, but it causes other problems about narrow dynamic range and/or high cost of the signal readout circuit. Variations in the threshold voltages of poly-Si TFTs that lead to the FPN are an essential problem resulting from the crystal structure of poly-Si TFTs being a polycrystal, and thus the poly-Si TFTs are hardly used for FPDs.

In recent years, amorphous oxide semiconductor has been developed rapidly. In—Ga—Zn—O is the representative case. The field-effect mobility of amorphous oxide semiconductor is about 10 $cm^2$/Vs to 20 $cm^2$/Vs and is an order-of-magnitude larger than that of a-Si:H or more. Therefore, the on-state resistance of a TFT formed by the amorphous oxide semiconductor is an order of magnitude smaller than that of an a-Si:H TFT or less. Further, since its structure is amorphous, the problem that threshold voltages vary largely does not arise like poly-Si TFTs do.

JP-A No. 2009-71057 discloses an example of applying amorphous oxide semiconductor to an image sensor (see FIG. 3 of the document). The image sensor described therein has a structure in which a plurality of photodetectors are arranged on a substrate in layers, where each photodetector includes a switching element and a photoelectric conversion section having sensitivity to a specific wavelength. A unit structure of the photodetector is illustrated in FIG. 14. This structure is formed by arranging a TFT as a switching element 100 and a photoelectric transducer 800 on the substrate 200 in layers, with passivation film 150 inserted between them. The TFT is composed of a gate electrode 110, a gate insulating film 120, an amorphous oxide semiconductor film 130 and source and drain electrodes 140. The photoelectric transducer 800 is composed of a lower electrode 810, a photoelectric conversion film 820 and an upper electrode 830. If amorphous oxide semiconductor is applied to an image sensor as in this case, it may be possible to achieve high speed signal read-out.

Although amorphous oxide semiconductor has excellent characteristics, it has problems of being unable to control off-state current depending on the manufacture method. The cause of this problem is that control of oxygen deficiency (oxygen holes) of the amorphous oxide semiconductor is difficult as described in JP-A No. 2008-42088 (see paragraph 0006) and JP-A No. 2008-60419 (see paragraph 0005 of the document). As a countermeasure, JP-A No. 2008-42088 discloses a structure that two insulating layers that are laminated so as to sandwich an amorphous oxide semiconductor layer, and a technique of making oxygen hole concentration of either one of two interfaces of the insulating layers in contact with the amorphous oxide semiconductor layer smaller than oxygen hole concentration in an amorphous oxide semiconductor film (see claim 10 of the document). In addition, JP-A No. 2008-60419 discloses a structure that a first insulating layer and a second insulating layer are laminated on an amorphous oxide semiconductor film, and a method of oxidizing the first insulating layer before laminating the second insulating layer thereon (see claim 1 of the document).

However, in cases where amorphous oxide semiconductor is applied to TFTs in an FPD having a structure where TFTs, which are switching elements, are formed on a substrate, and then photoelectric transducers made of a-Si:H are formed as illustrated in FIG. 13, the inventors of the present application found that characteristics of the TFTs vary largely and thus the image sensor cannot be operated stably even if manufacturing methods described in, for example, JP-A Nos. 2008-42088 and 2008-60419 are applied to the FPD. The result was the same in cases where photoelectric transducers made of a-Si:H are formed on the substrate, and then TFTs made of amorphous oxide semiconductor are formed thereon.

As a result of a further analysis of the inventors, the cause of the above matter has been found as follows. That is, in a case where a film of amorphous oxide semiconductor is formed on a substrate, and then an a-Si:H film is formed thereon, hydrogen contained in raw material gas of the a-Si:H film permeates the film of amorphous oxide semiconductor, which causes the characteristics deterioration of the TFTs. In another case where an a-Si:H film is formed and then a film of amorphous oxide semiconductor is formed thereon, hydrogen is separated from the a-Si:H film, which forms photoelectric transducers, as a result of the temperature rise caused upon a situation, such as a situation that the film of amorphous oxide semiconductor is formed and a situation that an insulating film to be laminated on the TFTs is formed, and the hydrogen permeates up to the film of the amorphous oxide semiconductor, which also causes the characteristics deterioration of the TFTs.

The present invention seeks to solve the problems.

SUMMARY

In view of the above-described issues, there are provided illustrative image sensors and illustrative manufacturing methods of such an image sensor, where the image sensors have a structure that each photoelectric transducer includes a hydrogenated amorphous silicon layer and each switching element includes an amorphous oxide semiconductor layer, and can suppress characteristic deterioration of the switching element.

An image sensor according to one aspect of the present invention is an image sensor comprising: a substrate; and photoelectric transducers and switching elements formed in layers on the substrate in this order. Each of the photoelectric transducers includes a hydrogenated amorphous silicon layer. Each of the switching elements includes an amorphous oxide semiconductor layer. The image sensor further comprises a blocking layer arranged between the hydrogenated amorphous silicon layers of the photoelectric transducers and the amorphous oxide semiconductor layers of the switching elements, where the blocking layer suppresses penetration of hydrogen separated from the hydrogenated amorphous silicon layers.

In the image sensor, the blocking layer may be arranged between the photoelectric transducers and the switching elements. Further, the blocking layer may include a film made of at least one material selected from a group consisting of SiC, $Al_2O_3$, $Y_2O_3$ and AlN. In addition, the image sensor may have a structure that the photoelectric transducers receive light traveling toward a top of the substrate, where the top of the substrate is a side where the photoelectric transducers are formed; and the blocking layer may have a laminated structure in which insulating films are formed on the top surface and the bottom surface of the film made of the at least one material, for example, a laminated structure in which the film made of the at least one material is sandwiched by SiN films.

In the image sensor, each of the photoelectric transducers may include a hydrogenated amorphous silicon carbide layer laminated on a top or on the top and bottom of the hydrogenated amorphous silicon layer, where the hydrogenated amorphous silicon carbide layer functions as the blocking layer.

The image sensor may further comprise a phosphor layer on a bottom surface of the substrate or over the switching elements so as to be used for a radiographic imaging apparatus, where the bottom surface is an opposite surface of the substrate to a surface at a side where the photoelectric transducers are formed. Further, the image sensor may further comprise a plurality of pixels arranged in matrix, wherein the hydrogenated amorphous silicon layers of the photoelectric transducers may form a layer being continuous over the plurality of pixels, and in each of the plurality of pixels, the hydrogenated amorphous silicon carbide layer on the top of the hydrogenated amorphous silicon layer and an upper electrode of the photoelectric transducer may be isolated from those in the other pixels.

A method of manufacturing an image sensor according to another aspect of the present invention is a method of manufacturing an image sensor including a substrate, and photoelectric transducers and switching elements arranged in layers on the substrate. The method comprises: forming the photoelectric transducers each including a hydrogenated amorphous silicon layer, on the substrate; forming the switching elements each including an amorphous oxide semiconductor layer, in layers over the photoelectric transducers, after the forming the photoelectric transducers; and forming a blocking layer between the forming the photoelectric transducers and the forming the switching elements, where the blocking layer suppresses penetration of hydrogen separated from the hydrogenated amorphous silicon layers.

A method of manufacturing an image sensor according to another aspect of the present invention is a method of manufacturing an image sensor including a substrate, and photoelectric transducers and switching elements arranged in layers on the substrate. The method comprises: forming the photoelectric transducers each including a hydrogenated amorphous silicon layer, on the substrate; and forming the switching elements each including an amorphous oxide semiconductor layer, in layers over the photoelectric transducers, after the forming the photoelectric transducers. The forming the photoelectric transducers includes forming a hydrogenated amorphous silicon carbide layer laminated on a top of the hydrogenated amorphous silicon layer of each of the photoelectric transducers, where the hydrogenated amorphous silicon carbide layer functions as a blocking layer suppressing penetration of hydrogen separated from the hydrogenated amorphous silicon layers.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

DETAILED DESCRIPTION

Illustrative embodiments of image sensors and manufacturing methods of an image sensor will be described below with reference to the drawings. It will be appreciated by those of ordinary skill in the art that the description given herein with respect to those figures is for exemplary purposes only and is not intended in any way to limit the scope of potential embodiments may be resolved by referring to the appended claims.

According to the illustrative image sensors and the illustrative methods of manufacturing an image sensor as embodiments of the present invention, it is possible to read signals of a high resolution image sensor at high speed. Accordingly, it is possible to provide an FPD used for X-ray detection, which has higher resolution and supports fluoroscopy (taking moving or real-time images).

With respect to the reason, an illustrative image sensor uses amorphous oxide semiconductor for switching elements. The field-effect mobility of the amorphous oxide semiconductor is about 10 $cm^2$/Vs to 20 $cm^2$/Vs, which is an order-of-magnitude larger than that of a-Si:H or more. Accordingly, it is possible to read signals from a high resolution image sensor at high speed.

According to the illustrative methods of manufacturing an image sensor as embodiments of the present invention, it is possible to suppress manufacturing variations of image sensors that use amorphous oxide semiconductor for switching elements, and thus improve the yield.

This is because a a-Si:H layer to be photoelectric transducers, is formed before forming switching elements in the illustrative image sensor. Accordingly, it is possible to prevent hydrogen contained in raw material gas of the a-Si:H layer from permeating a layer the amorphous oxide semiconductor. Further, in the illustrative image sensor, a blocking layer that suppresses penetration of hydrogen is arranged between the hydrogenated amorphous silicon layers of the photoelectric transducers and the amorphous oxide semiconductor layers of the switching elements, for example, between the photoelectric transducers and the switching elements. Accordingly, it is possible to prevent hydrogen separating from the a-Si:H layer due to, for example, heat at the time of forming the switching elements, and from permeating the amorphous oxide semiconductor. Furthermore, the blocking layer can be constituted as a part of each photoelectric transducer as a layer of SiC, and thus it is possible to reduce the manufacturing cost.

Hereafter, embodiments of the present invention will be described in detail with reference to the drawings. It should be noted that, in order to have visibility of the drawings, the size and the scale of each component in each drawing are changed as appropriate. In each of the cross-sectional views, components are distinguished by their hatching.

Embodiment 1

Figure 1:
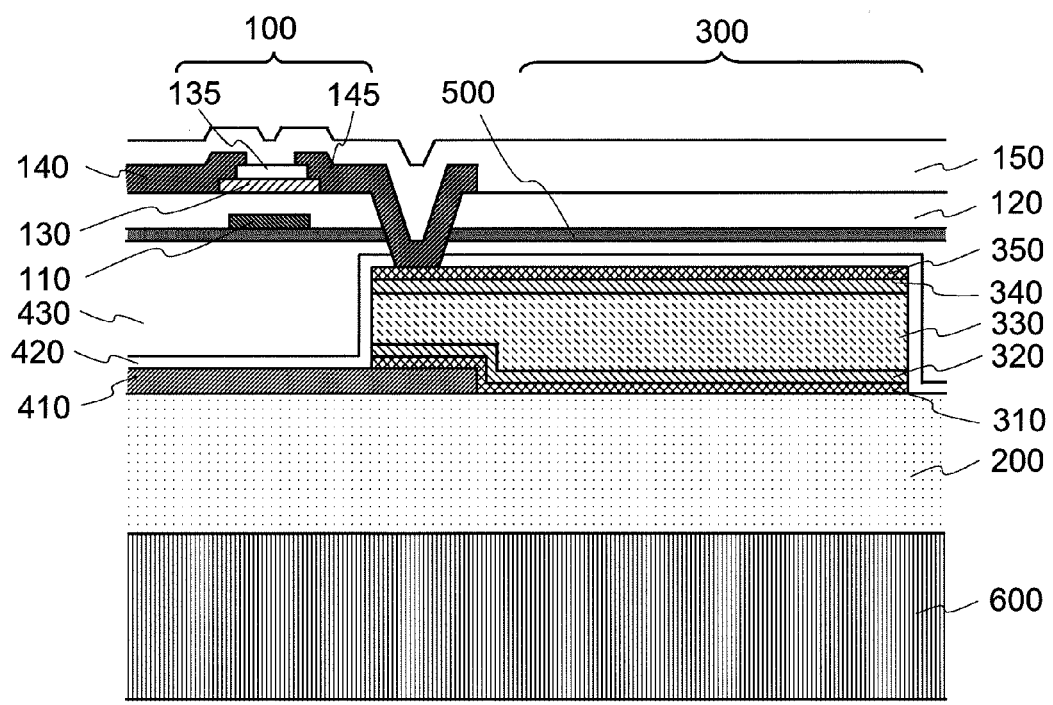
FIG. 1 is a cross-sectional view illustrating a structure of an image sensor according to EMBODIMENT 1.

FIG. 1 is a cross-sectional view of an image sensor according to EMBODIMENT 1. The image sensor of the present embodiment has a structure that a photoelectric transducers 300 made of a-Si:H, and switching elements 100 as amorphous oxide semiconductor TFTs are arranged in layers on a substrate 200. A blocking layer 500 that suppresses penetration of hydrogen is arranged between the photoelectric transducers 300 and the switching elements 100.

Each photoelectric transducer 300 is constituted by: a lower electrode 310; a p-a-Si:H layer 320, which is a layer of p type hydrogenated amorphous silicon; an i-a-Si:H layer 330, which is a layer of intrinsic hydrogenated amorphous silicon; an n-a-Si:H layer 340, which a layer of is n type hydrogenated amorphous silicon; and an upper electrode 350. This structure is provided under the assumption that light enters the photoelectric transducers 300 from the side of the lower electrode 310, that is, the photoelectric transducers 300 receives light coming from the bottom side thereof. Each switching element 100 is constituted by a gate electrode 110, a gate insulating film 120, an amorphous oxide semiconductor film 130, a channel protection film 135, a drain electrode 140, and a source electrode 145. It is desirable if the lower electrode 310 of each photoelectric transducer 300 is electrically connected to a common electrode 410, and if a protective film 420 and a flattening film 430 are formed after forming the photoelectric transducers 300. In addition, when using the image sensor as an FPD for detecting X-rays, a phosphor layer 600 is arranged on the bottom surface of the substrate 200 being a glass plate, where the bottom surface is opposite to the surface where the photoelectric transducers are formed.

Next, a manufacturing process of the image sensor having the above-described structure will be described. A photoelectric transducers 300 are formed on the substrate 200. Specifically, a common electrode 410 is formed on the substrate 200. For example, the substrate 200 can be made of glass, and the common electrode 410 can be made of a material, such as Al and Cr, which has relatively small resistivity. The lower electrode 310 of each photoelectric transducer is formed thereon. The lower electrode 310 can be made of a material for transparent electrodes, such as ITO (Indium Tin Oxide). Thereafter, the p-a-Si:H layer 320, the i-a-Si:H layer 330 and the n-a-Si:H layer 340 are laminated and patterned. At this time, it is desirable to form the three layers continuously in the same vacuum chamber. The upper electrode 350 of each photoelectric transducer is formed thereon. For example, the upper electrode 350 can be made of Cr. Next, the protective film 420 and the flattening film 430 are formed thereon. For example, the protective film 420 can be a single-layer film of $SiO_2$ or SiN, or a multilayer film constituted by these materials. For example, the flattering film 430 can be made of acrylate resin. Here, there are cases where the flattering film 430 need not be provided depending on flatness of the arrangement of the photoelectric transducers and the switching elements.

Next, in the present embodiment, a blocking layer 500 is formed thereon. The blocking layer 500 can be made of a material that can suppress penetration of hydrogen, such as SiC, $Al_2O_3$, $Y_2O_3$ and AlN.

The switching elements 100 are formed thereon. Specifically, the gate electrode 110 and the gate insulating film 120 of each switching element are formed in order. For example, the gate electrode 110 can be made of Al or Cr, or alloy of these metals, and the gate insulating film 120 can be made of $SiO_2$. Here, there are cases where insulation of the gate electrodes 110 deteriorates depending on the kind of the blocking layer 500. In that case, an insulating layer, such as a layer of $SiO_2$, may be arranged between the blocking layer 500 and the gate electrodes 110. Next, an amorphous oxide semiconductor film 130 of each switching element is formed. The amorphous oxide semiconductor film 130 can be a film of InGaZnO or an oxide film including at least one of In, Ga and Zn. Annealing treatment may be applied after forming the amorphous oxide semiconductor film 130. Thereafter, the channel protection film 135 of each switching element may be formed. For example, the channel protection film 135 can be a film of $SiO_2$, if the channel protection film 135 is formed. After forming the channel protection film 135 and the amorphous oxide semiconductor film 130, a metallic film that is to be formed into a drain electrode 140 and a source electrode 145 of each switching element is layered and patterned into the electrodes. It is preferable that the metallic film that is to be formed into the drain electrode 140 and the source electrode 145 is made of a metal with low resistivity, for example, alloy of Al, and Mo and/or Ti. A passivation film 150 is formed thereon. For example, the passivation film 150 can be a single-layer film of $SiO_2$ or a multilayer film constituted by $SiO_2$ and SiN. After forming the passivation film 150, annealing treatment may be applied.

When the image sensor is used as an FPD for X-ray detection, a phosphor layer 600 is provided on the opposite surface of the substrate 200 to the surface where the photoelectric transducers 300 of the substrate 200 are arranged. For example, the phosphor layer 600 can be made of cesium iodide.

According to the present embodiment, it is possible to read signals of a high resolution image sensor at high speed, which allows FPDs used for X-ray detection to have higher resolution and to support fluoroscopy (taking moving or real-time images). Further, it is possible to suppress manufacturing variations of the image sensors and thus improve the yield. The reason for this will be described below.

In a large-sized image sensor (of 20 cm×20 cm or more), such as an FPD used for X-ray detection, the switching elements are made of a-Si:H. As the field-effect mobility of the a-Si:H is small such that it is 1 $cm^2/Vs$ or less, the signal read-out speed of the image sensor has been limited. The switching elements in the image sensor according to the present embodiment are made of amorphous oxide semiconductor. The field-effect mobility of amorphous oxide semiconductor is about 10 $cm^2/Vs$ to 20 $cm^2/Vs$, which is an order-of-magnitude larger than that of a-Si:H or more. Accordingly, it is possible to read signals of a high resolution image sensor at high speed.

Even if amorphous oxide semiconductor is used for the switching elements in the image sensor of the present embodiment, variations in characteristics of the switching devices can be suppressed. In an image sensor having a conventional structure, when TFTs of amorphous oxide semiconductor are used as the switching elements, it causes a problem that the characteristics of the TFTs become unstable. This is because when photoelectric transducers of a-Si:H are formed, hydrogen contained in raw material gas of the photoelectric transducers permeates a layer of the amorphous oxide semiconductors and causes oxygen deficiency. On the other hand, if the photoelectric transducers are formed first and the layer of amorphous oxide semiconductor is formed thereafter in an image sensor having a conventional structure, hydrogen also separates from a-Si:H and permeates in the layer of the amorphous oxide semiconductor because of heat conducted to the substrate at the time when the layer of amorphous oxide semiconductor is formed or upon other treatment of, for example, annealing. In the image sensor of the present embodiment, photoelectric transducers are formed on the substrate earlier, and then a blocking layer for suppressing penetration of hydrogen is formed thereon, and then a layer of amorphous oxide semiconductor is formed. In particular, when the blocking layer includes a film made of at least one material of SiC, $Al_2O_3$, $Y_2O_3$, and AlN, the hydrogen permeation coefficient of the film is substantially small compared with a film of $SiO_2$ or SiN having the same film thickness. Accordingly, it is possible to suppress the penetration of hydrogen coming from the photoelectric transducers and suppress variations in characteristics among the switching elements. For this reason, it is possible to manufacture an image sensor that uses amorphous oxide semiconductor with high yield.

Embodiment 2

Figure 2:
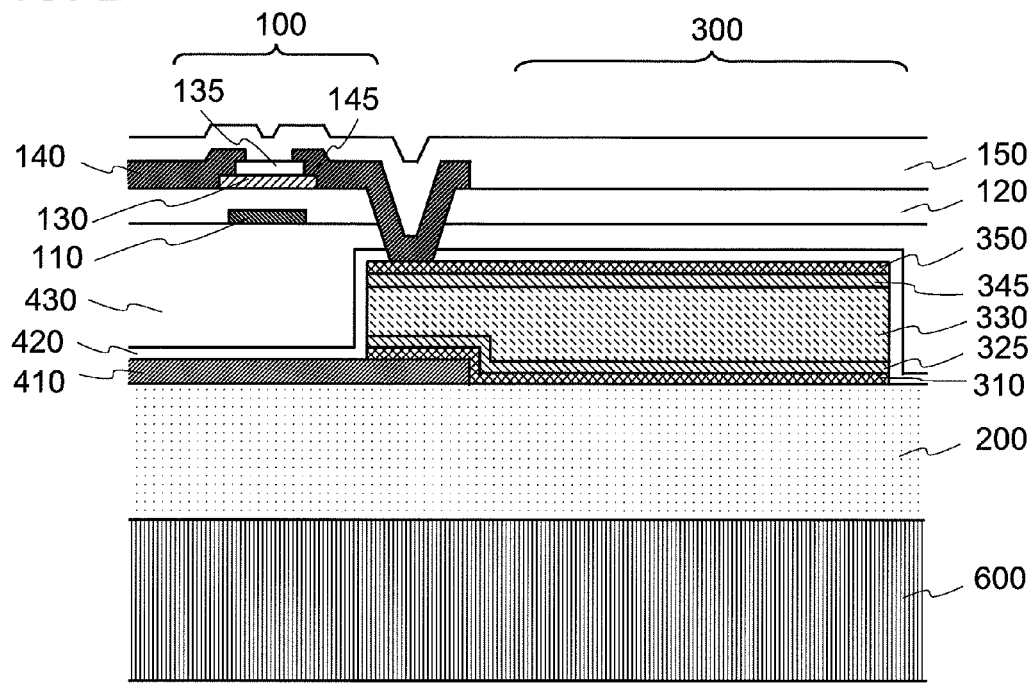
FIG. 2 is a cross-sectional view illustrating a structure of an image sensor according to EMBODIMENT 2.

FIG. 2 depicts a cross-sectional view of an image sensor according to EMBODIMENT 2. The image sensor of the present embodiment has a structure that photoelectric transducers 300 made of a-Si:H, and switching elements 100 as amorphous oxide semiconductor TFTs are arranged on a substrate 200 in layers.

The structure of the switching element is the same as the structure shown in EMBODIMENT 1. Each photoelectric transducer 300 is constituted by: a lower electrode 310; a p-a-SiC:H layer 325, which is a layer of p type hydrogenated amorphous silicon carbide; an i-a-Si:H layer 330, which is a layer of intrinsic hydrogenated amorphous silicon; an n-a-SiC:H layer 345, which is a layer of n type hydrogenated amorphous silicon carbide; and an upper electrode 350. That is, each photoelectric transducer 300 has a structure that includes, as an upper layer of the i-a-Si:H layer 330 being a layer of hydrogenated amorphous silicon (on the top of the layer of hydrogenated amorphous silicon), an n-a-SiC:H layer 345 which functions as a blocking layer. This structure is provided under the assumption that light enters the photoelectric transducers 300 from the side of the lower electrode 310, that is, the photoelectric transducers 300 receives light coming from the bottom side thereof. In addition, a layer of p-a-Si:H may be used instead of the p-a-SiC:H layer 325. It is desirable if the lower electrode 310 of each photoelectric transducer 300 is electrically connected to a common electrode 410, and a protective film 420 and a flattening film 430 are formed on the upper electrode 350 of each photoelectric transducer 300. In addition, when using the image sensor as an FPD for detecting X-rays, a phosphor layer 600 is arranged on the bottom surface of the substrate 200 being a glass plate, where the bottom surface is opposite to the surface where the above structures are formed.

It should be noted that the image sensor having the above-described structure can be manufactured by: forming the photoelectric transducers 300 on the substrate 200; forming switching elements 100 in layers over the photoelectric transducers 300; and if necessary, providing a phosphor layer 600 on the opposite surface of the substrate 200 to the surface where the photoelectric transducers 300 is arranged. In the manufacturing processes, each photoelectric transducer 300 includes the n-a-SiC:H layer 345 working as the blocking layer and laminated on the top of the i-a-Si:H layer 330 being a layer of hydrogenated amorphous silicon.

According to the present embodiment, as in EMBODIMENT 1, it is possible to read signals of a high resolution image sensor at high speed, which allows FPDs used for X-ray detection to have higher resolution and to support fluoroscopy (taking moving or real-time images). In addition, it is possible to suppress manufacturing variations of the image sensors and thus improve the yield. Further, it is possible to reduce the manufacturing cost of the image sensor. The reason will be described below.

The reason why the signal read-out speed of the image sensor can be increased is the same as the reason described in EMBODIMENT 1. In addition, the reason why manufacturing variations can be suppressed and the yield can be improved is the same as the reason described in EMBODIMENT 1.

The reason why the manufacturing cost can be reduced is that the blocking layer that suppresses penetration of hydrogen is substituted by a part of each photoelectric transducer in the present embodiment. Although a layer of silicon carbide SiC of each photoelectric has a function of suppressing the penetration of hydrogen, this is also used as an n type semiconductor layer (the top semiconductor layer) of each photoelectric transducer in the present embodiment. Accordingly, there is no need to newly provide a blocking layer as in EMBODIMENT 1. Accordingly, it is possible to reduce the manufacturing cost. The layer of SiC can also be used as a p type semiconductor layer in each photoelectric transducer by changing the impurity. Many P-I-N type photoelectric transducers have a structure to receive incident light on a p type semiconductor layer, considering the mobility of the carrier. However, when the layer of SiC is used as the p type semiconductor layer, the optical band gap spreads more than that of an a-Si layer, and thus it is possible to increase quantum efficiency. In order to manufacture the structure of the present embodiment, there is prepared a raw material gas system for forming the n-a-SiC:H layer 345 which functions as a blocking layer. Thus, it is possible to change the p type semiconductor layer into SiC easily without additionally preparing a raw material gas system. Accordingly, it is possible to create an image sensor having high quantum efficiency at low cost.

EXAMPLES

Example 1

Figure 3:
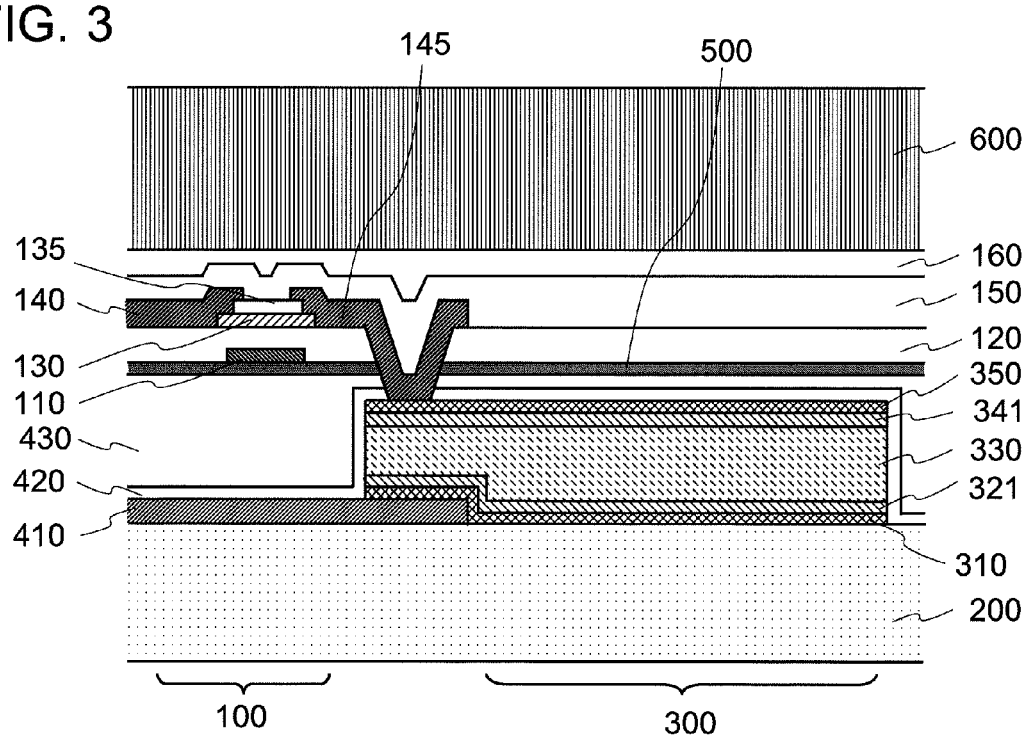
FIG. 3 is a cross-sectional view illustrating a structure of an image sensor according to EXAMPLE 1.

FIG. 3 depicts a structure of another example of the image sensor according to EMBODIMENT 1. The structure is the same as that of the former example in the respect that the photoelectric transducers 300, the blocking layer 500 and the switching elements 100 are formed on the substrate 200 in layers, but is different in that the phosphor layer 600 which converts X-rays into light is formed over the switching elements 100. With respect to this structure, the image sensor is irradiated with X-rays from its surface where the phosphor layer 600 is arranged. Since light coming from the phosphor layer 600 (and traveling toward the top of the substrate) enters the photoelectric transducers 300 from the upper side, it is desirable to make the structure of each photoelectric transducer 300 as in the following. The lower electrode 310 of each photoelectric transducer 300 can be made of a material having small resistivity, such as Al and Cr, since it does not need to transmit light. In this case, the common electrode 410 and the lower electrode 310 of each photoelectric transducer 300 can be formed in the same metal layer. The n-a-Si:H layer 321, the i-a-Si:H layer 330, and the p-a-Si:H layer 341 are laminated on the lower electrode 310 of each photoelectric transducer 300. In so doing, a structure in which holes move to the light-entering side of the photoelectric transducers 300 can be obtained. Thus, hole-electron pairs generated in the i-a-Si:H layer 330 can be efficiently collected, and thus afterimage characteristics improve also. In addition, a flattening film 160 may be arranged between the switching elements 100 and the phosphor layer 600.

In addition, the blocking layer 500 can be made of at least one of SiC, $Al_2O_3$, $Y_2O_3$ and AlN, which are the same materials as the materials shown in EMBODIMENT 1. However, since light irradiated onto the photoelectric transducer 300 passes through the blocking layer 500 in the structure of the present example, it is desirable to use a structure which can prevent light from being absorbed in the blocking layer 500 or being reflected on the blocking layer 500. All of the above-described materials applicable to the blocking layer 500 has almost no absorptive property for visible light but have the refractive index larger than that of, for example, $SiO_2$ or acrylate resin. In particular, the refractive index of SiC is about 2.6, which is way larger than 1.45 of $SiO_2$ and about 1.5 of acrylate resin. Accordingly, by forming the blocking layer 500 so as to have a multilayer structure of SiN, SiC and SiN films (that is, a laminated structure that a SiC film is sandwiched by SiN films), reflection of light thereon can be reduced substantially. This is because the refractive index of SiN is about 2, which is an interim value between the refractive index of SiO$_2$ or acrylate resin and the refractive index of SiC, and a layer of SiN serves as anti-reflection coating. It should be noted that the refractive indices of other materials are: Al$_2$O$_3$: about 1.7; Y$_2$O$_3$: about 1.8; and AlN: about 2.1, and thus needless to say, it is possible to obtain an anti-reflection effect by combining any one of those materials with thin films having appropriate refractive indices to prepare a multilayer structure as in the case of SiC described above.

According to the present example, as in EMBODIMENT 1, it is possible to read signals of a high resolution image sensor at high speed, which allows FPDs used for X-ray detection to have higher resolution and to support fluoroscopy (taking moving or real-time images). In addition, it is possible to suppress manufacturing variations of image sensors and thus improve the yield. Further, it is possible to improve spatial resolution of the image sensor. The reason will be described below.

The reason why the signal read-out speed of the image sensor can be increased is the same as the reason described in EMBODIMENT 1. In addition, the reason why manufacturing variations can be suppressed and the yield can be improved is the same as the reason described in EMBODIMENT 1.

Next, the reason why the spatial resolution can be improved will be described. If the phosphor layer 600 is arranged on the surface the substrate 200 as in EMBODIMENT 1, where the surface is opposite to the surface at the side of the photoelectric transducers 300 and the switching elements 100, light emitted from the phosphor layer 600 is propagated in the substrate 200 in its thickness direction and enters the photoelectric transducer 300. Here, the phosphor layer 600 emits light diffused regardless of the propagating direction of X-rays. Accordingly, if the substrate 200 is thick, the probability that light does not reach to a concerned photoelectric transducer located on a straight line in the propagating direction of the X-rays increases but reaches to neighboring photoelectric transducers. As a result, the spatial resolution decreases. However, in this example, the phosphor layer 600 is arranged above the switching element 100. Between the photoelectric transducers 300 and the phosphor layer 600, there are arranged the protective film 420, the flattening film 430, the blocking layer 500, and the gate insulating film 120, the passivation film 150, and the flattening film 160 of each switching element. It is possible to form all those film thicknesses in a total of 10 micrometers or less. This is overwhelmingly thinner than the thickness of the substrate 200. In addition, SiC, Al$_2$O$_3$, Y$_2$O$_3$ and AlN, which can be used for the blocking layer 500, have large transmittance over a range from infrared region to ultraviolet region. Therefore, the quantum efficiency is rarely reduced. Accordingly, the probability of light spreading in the circumferential of the photoelectric transducer on which the light should be irradiated primarily can be reduced, and thus the spatial resolution increases.

Example 2

Figure 4:
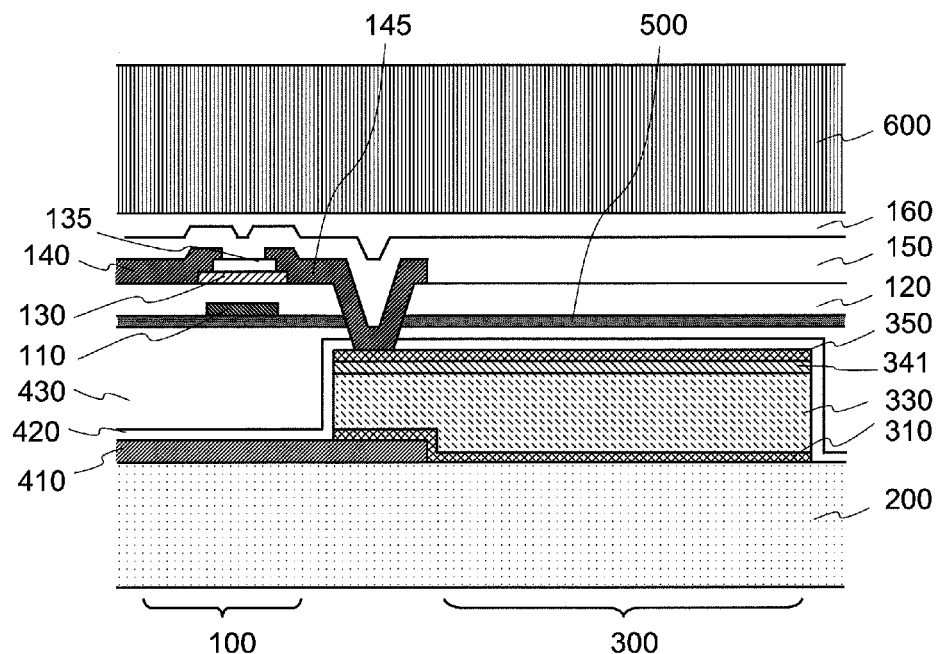
FIG. 4 is a cross-sectional view illustrating a structure of an image sensor according to EXAMPLE 2.

FIG. 4 depicts a structure of another example of the image sensor according to EMBODIMENT 1. The structure is the same as that of EXAMPLE 1 in the respect that the photoelectric transducers 300, the blocking layer 500 and the switching elements 100 are formed on the substrate 200 in layers and then the phosphor layer 600 is further arranged on the layered structure, but is different in the structure of each photoelectric transducers 300. In this example, each photoelectric transducer 300 serves as a Schottky diode. On a lower electrode 310 of each photoelectric transducer 300, an i-a-Si:H layer 330, a p-a-Si:H layer 341 and an upper electrode 350 are laminated in the order. Light coming from the phosphor layer 600 enters the photoelectric transducers 300 from the side of the upper electrode. In order to make the barrier height of the Schottky diode suitable, it is important to select metal to be formed into the lower electrode 310 so as to be suitable for the semiconductor layers. Specifically, a combination is selected such that the work function of metal is higher than the electron affinity of the semiconductor layers. When the semiconductor layers are made of a-Si:H, it is possible to prepare an excellent Schottky diode by using, for example, Cr for the lower electrode 310. The upper electrode can be made by using a transparent electrode, such as an ITO electrode.

According to this example, as in EXAMPLE 1, it is possible to make FPDs used for X-ray detection to have higher resolution and to support fluoroscopy (taking moving or real-time images), and improve the yield. In addition, it is possible to improve spatial resolution of the image sensor. Further, it is possible to reduce the manufacturing cost. The reason will be described below.

The reason why the signal read-out speed of the image sensor can be increased is the same as the reason described in EMBODIMENT 1. In addition, the reason why manufacturing variations can be suppressed and the yield can be improved is the same as the reason described in EMBODIMENT 1. The reason why the spatial resolution can be improved is the same as the reason described in EXAMPLE 1.

In this example, a Schottky diode is used as each photoelectric transducer 300. As described above, this structure has no n-a-Si:H layer. Accordingly, the manufacturing cost can be reduced for an amount corresponding to the semiconductor layer of n-a-Si:H being not laminated.

Example 3

Figure 5:
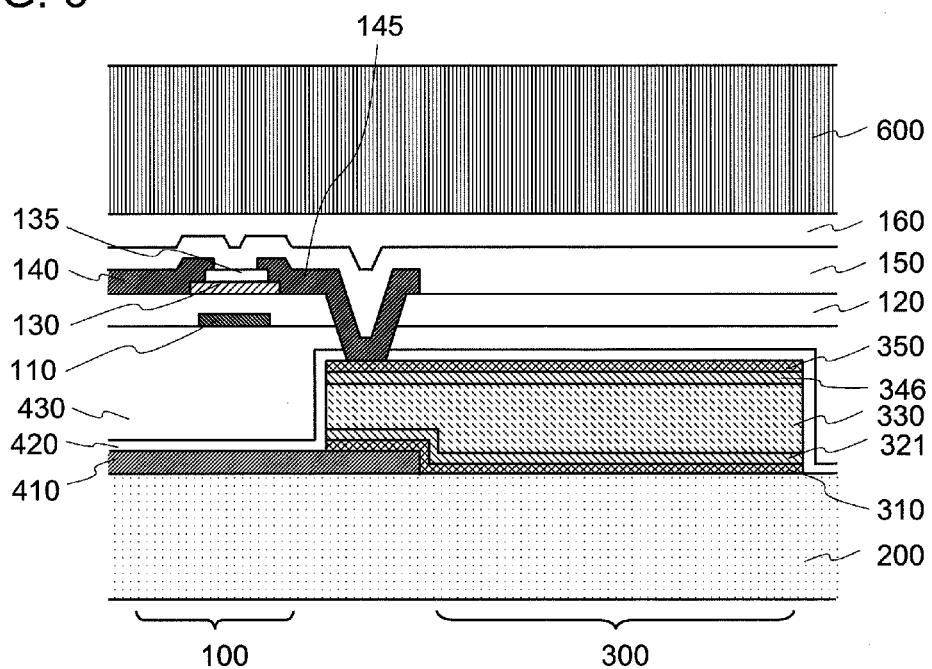
FIG. 5 is a cross-sectional view illustrating a structure of an image sensor according to EXAMPLE 3.

FIG. 5 depicts a structure of another example of the image sensor according to EMBODIMENT 2. The structure is the same as that of the former example in the respect that the photoelectric transducers 300 and the switching elements 100 are formed on the substrate 200 in layers, but is different in that the phosphor layer 600 is arranged over the switching elements 100 with the flattening film 160 inserted between them. Further, it is desirable if each photoelectric transducers 300 has a structure including the lower electrode 310, the n-a-Si:H layer 321, the i-a-Si:H layer 330, the p-a-SiC:H layer 346 and the upper electrode 350. In the structure, a n-a-SiC:H layer may be used instead of the n-a-Si:H layer 321.

According to the present example, as in EMBODIMENT 2, it is possible to make FPDs used for X-ray detection to have higher resolution and to support fluoroscopy (taking moving or real-time images), improve the yield, and reduce the manufacturing cost. Further, it is possible to improve spatial resolution of the image sensor as in EXAMPLE 2.

The reason why the image sensor of this example can increase the resolution, support fluoroscopy (motion picture imaging), improve the yield, and reduce the manufacturing cost is the same as the reason described in EMBODIMENT 2. The reason why the spatial resolution can be improved is the same as the reason described in EXAMPLE 1.

Example 4

Figure 6:
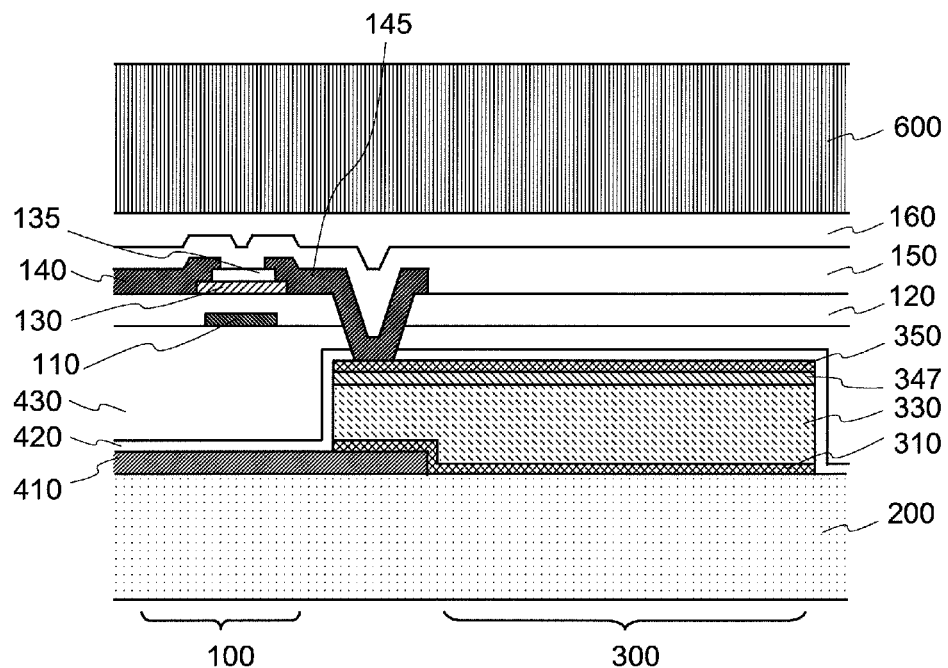
FIG. 6 is a cross-sectional view illustrating a structure of an image sensor according to EXAMPLE 4.

FIG. 6 depicts a structure of another example of the image sensor according to EMBODIMENT 2. The structure is the same as that of EXAMPLE 3 in the respect that the photoelectric transducers 300, the switching elements 100 and the phosphor layer 600 are formed on the substrate 200 in layers, but is different in the structure of each photoelectric transducers 300. Each photoelectric transducer 300 used herein is constituted by the lower electrode 310, the i-a-Si:H layer 330, the p-a-SiC:H layer 347, and the upper electrode 350. That is, it has a structure of a Schottky barrier diode. Metal used for the lower electrodes 310 is selected such that its work function is larger than the electron affinity of the semiconductor layers. In this example, the lower electrodes 310 are made of Cr, and in this case, the common electrode 410 may be formed with the same metal as the lower electrode 310. The upper electrodes 350 can be made of ITO that penetrates light.

According to this example, as in EXAMPLE 3, it is possible to make the image sensor achieve an increased resolution and support fluoroscopy (taking moving or real-time images), to improve the yield, and to improve the spatial resolution of the image sensor. Further, it is possible to lower the manufacturing cost more than the image sensor shown in EXAMPLE 3.

The reason why the image sensor of this example can achieve the increased resolution, support fluoroscopy (taking moving or real-time images), and improve the yield is the same as the reason described in EMBODIMENT 2. The reason why the spatial resolution can be improved is the same as the reason described in EXAMPLE 1. The reason why the manufacturing cost can be lowered more than the image sensor of EXAMPLE 3 is because the number of semiconductor layers constituting each photoelectric transducer is two, which is less than three, which is the number of semiconductor layers constituting the photoelectric transducer shown in EXAMPLE 3.

Example 5

Figure 7:
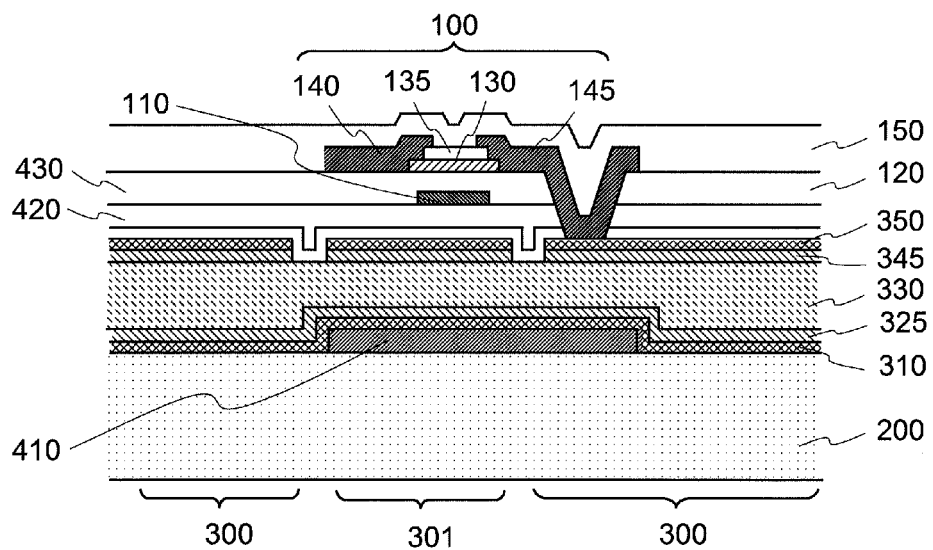
FIG. 7 is a cross-sectional view illustrating a structure of an image sensor according to EXAMPLE 5.

FIG. 7 depicts a structure of another example of the image sensor related to EMBODIMENT 2. This structure includes a dummy area 301 having the same layer structure as the photoelectric transducers 300 and arranged between photoelectric transducers 300 in two adjoining pixels. As for at least the upper electrode and the amorphous semiconductor layer which is in contact with the upper electrode and includes impurities added thereto, those in the dummy area 301 are electrically isolated from those in the photoelectric transducer 300. In the example in FIG. 7, each photoelectric transducer 300 has a laminated structure of the lower electrode 310, the p-a-SiC:H layer 325 which is a layer of a p type hydrogenated amorphous silicon carbide, the i-a-Si:H layer 330 which is a layer of an intrinsic hydrogenated amorphous silicon, the n-a-SiC:H layer 345 which is a layer of a n type hydrogenated amorphous silicon carbide, and the upper electrode 350, in this order from the substrate 200 side. In this structure, the upper electrode 350 and the layer of hydrogenated amorphous silicon carbide arranged at the upper side (the n-a-SiC:H layer 345 as a layer of n type hydrogenated amorphous silicon carbide herein) in the photoelectric transducer 300 are electrically isolated from those in the dummy area 301 in each pixel, and at least the hydrogenated amorphous silicon layer (the i-a-Si:H layer 330, the p-a-SiC:H layer 325, and the lower electrode 310 herein) is continuous over the pixels.

Figure 8:
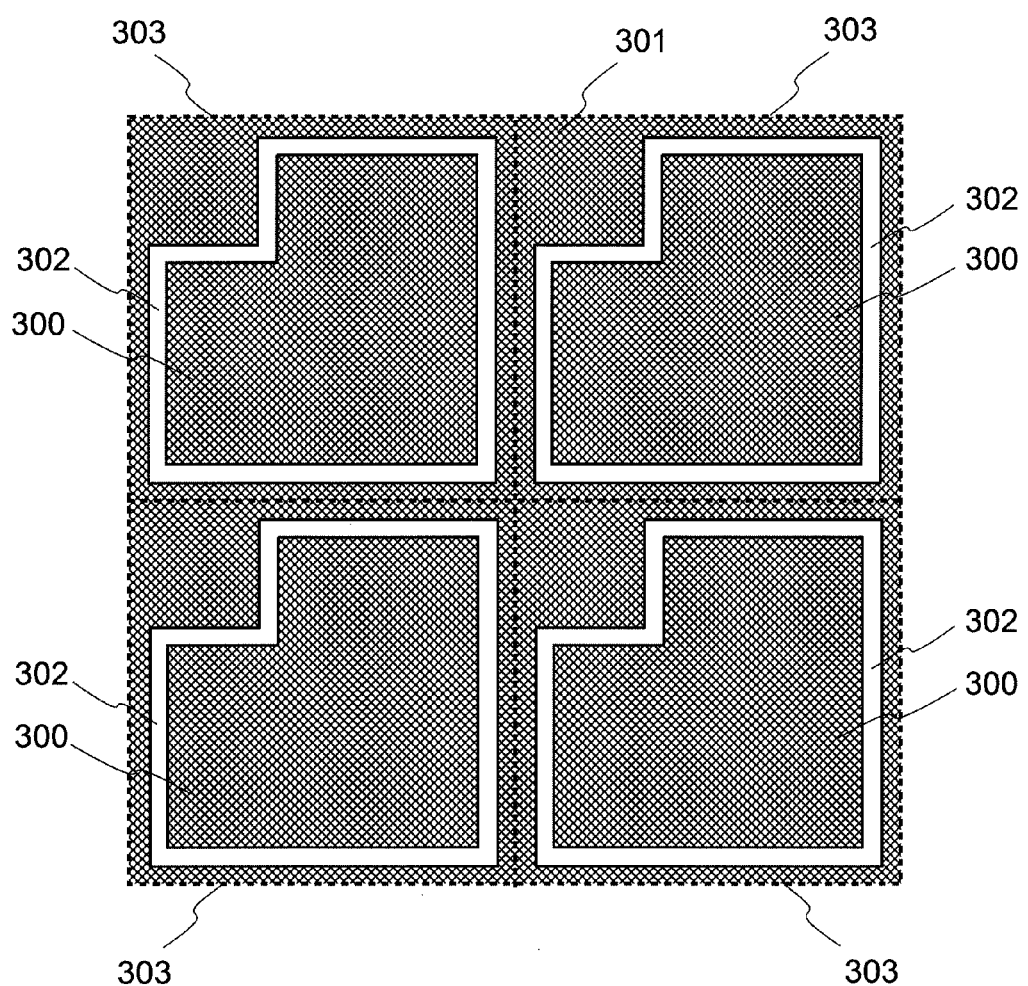
FIG. 8 is a top view illustrating the structure of the image sensor according to EXAMPLE 5.

FIG. 8 depicts a top view of the upper electrodes 350, wherein hatched portions indicate regions where the upper electrodes 350 are arranged. As can be seen from FIG. 7 and FIG. 8, the whole area is divided into sections of pixels 303, and each of the sections includes the photoelectric transducer 300 and the dummy area 301 arranged with the insulating region 302 inserted between them, where the insulating region 302 is prepared by removing the upper electrode 350 and the n-a-SiC:H layer 345 as a layer of n type hydrogenated amorphous silicon carbide from the layered structure. By having such a layout, the upper electrode of the photoelectric transducer 300 of each pixel is electrically isolated from the upper electrode of the photoelectric transducer 300 of the neighboring pixel. Although not illustrated in FIG. 8, each switching element 100 prepared by using an amorphous oxide semiconductor TFT is arranged at a position over the corresponding dummy area 301.

Although FIG. 7 does not illustrate a phosphor layer, the image sensor of the present example includes a phosphor layer, which may be arranged on a surface of the substrate 200 opposite to the surface where the photoelectric transducers 300 are formed as in EMBODIMENT 1, or may be arranged over the switching elements 100 as in EXAMPLE 1. In addition, upon removing the upper electrode 350 and the n-a-SiC:H layer 345 as a layer of n type hydrogenated amorphous silicon carbide for preparing each insulating region 302, no problem will arise even if the i-a-Si:H layer 330 as a layer of intrinsic hydrogenated amorphous silicon being partially etched in the insulating region 302.

According to the present example, as in EMBODIMENT 2, it is possible to read signals of a high resolution image sensor at high speed, and it is possible to make FPDs used for X-ray detection to have higher resolution and to support fluoroscopy (taking moving or real-time images). In addition, it is possible to suppress manufacturing variations in characteristics of the image sensors and improve the yield. Further, it is possible to reduce the manufacturing cost of the image sensors.

The reason why it is possible to reduce the manufacturing cost of the image sensor of this example is the same as the reason described in EMBODIMENT 2. In addition, the reason why the image sensor of this example can increase the resolution, support fluoroscopy (taking moving or real-time images), and improve the yield is as follows, in addition to the reason described in EMBODIMENT 2. That is, when forming the switching elements 100 as amorphous oxide semiconductor TFTs, hydrogen separates from the a-Si:H layer, which is a layer of hydrogenated amorphous silicon and constitutes each of the photoelectric transducers, due to heat conducted to the substrate on forming films that constitute the switching elements 100 and heat conducted to the substrate when carrying out annealing treatment of the switching elements 100. The image sensor of the present example can further more reduce penetration of the separated hydrogen into the amorphous oxide semiconductor layers. This is because each i-a-Si:H layer 330, which is a layer of intrinsic hydrogenated amorphous silicon containing most hydrogen in the layered structure, has a very small cross-sectional area, and the area in contact with the protective film 420 is reduced.

Example 6

Figure 9:
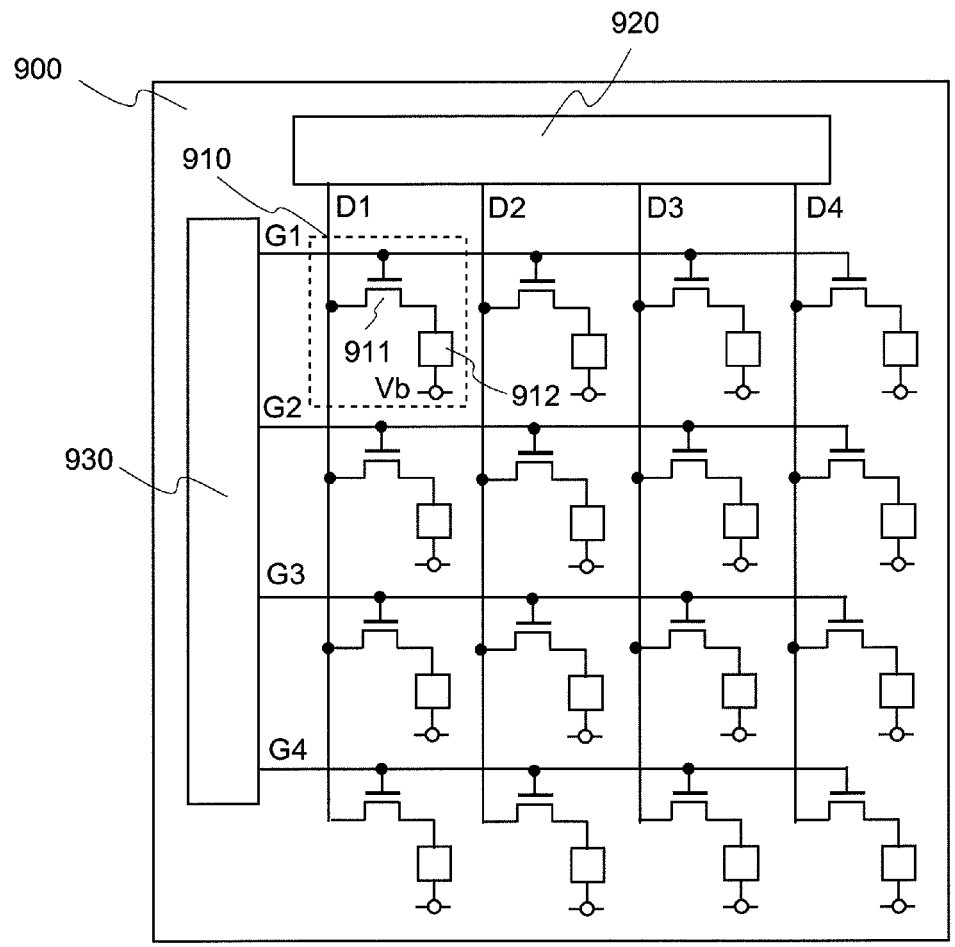
FIG. 9 is a block diagram illustrating a circuit arrangement of the image sensor of the present invention.

FIG. 9 depicts a circuit diagram of an example that an image sensor is formed using the structures described in EMBODIMENTS 1 and 2 and EXAMPLES 1 to 5. The image sensor 900 has a structure that pixels 910 are arranged in matrix, where each of the pixels 910 contains a TFT 911 which is a switching element, and a photoelectric transducer 912. Although FIG. 9 illustrates an example where 4×4 pixels are arranged in a matrix form, needless to say, the number of pixels can be changed according to the objective. Drain terminals of TFTs 911 lined up in a pixel column in a longitudinal direction are connected to the same data line (D1 to D4), and gate terminals of TFTs lined up in a pixel row in the horizontal direction are connected to the same gate line (G1-G4). One end of each photoelectric transducer 912 is connected to a corresponding TFT. The other end of each photoelectric transducer 912 is connected to a corresponding bias wire Vb. The data lines D1 to D4 are connected to a signal readout circuit 920, and the gate lines G1 to G4 are connected to a gate drive circuit 930.

Figure 10:
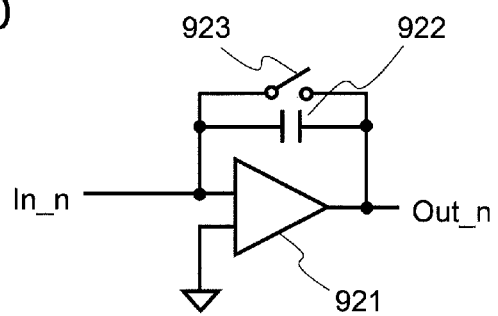
FIG. 10 is a circuit diagram of a signal readout circuit applicable to the image sensor according to the present invention.

The signal readout circuit 920 can be prepared by using circuits illustrated in FIG. 10 whose number is the same as that of the data lines. FIG. 10 depicts an example that uses an integrating circuit constituted by an operational amplifier 921, an integral capacity 922, and a reset switch 923 as the signal readout circuit. The data lines D1 to D4 are connected to an input terminal In of the integrating circuit in the signal readout circuit 920. Bias voltage Vb is set to an electric potential that makes reverse bias being applied to a p-i-n diode or a Schottky diode that constitutes the photoelectric transducer 912. Such electric potential is determined by an equivalent capacity of the photoelectric transducer 912 and the maximum light exposure amount irradiated onto the image sensor. The electric potential is preferably determined, even when a maximum amount of light is irradiated onto the image sensor, so as to make the electric potential to such an extent that the electric field in a reverse bias direction remains inside the photoelectric transducer 912.

Figure 11:
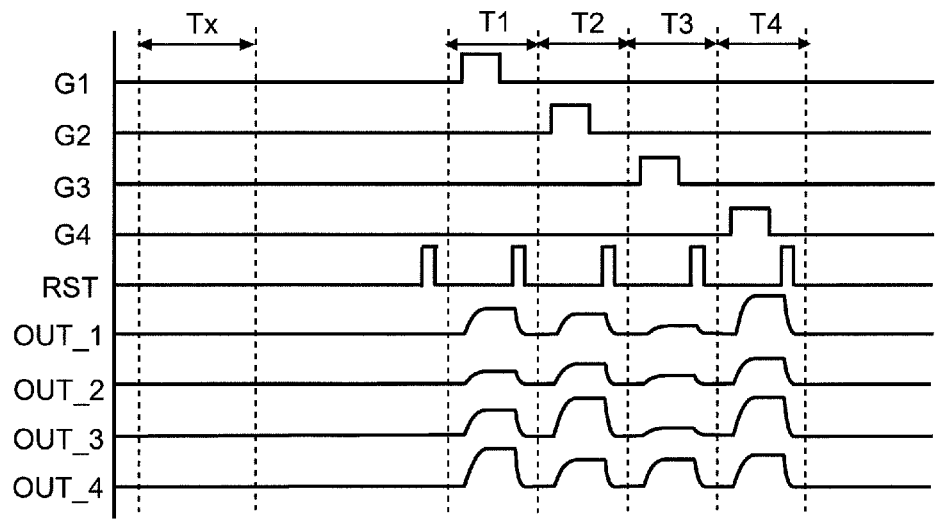
FIG. 11 is a timing chart illustrating operations of the image sensor according to the present invention.

FIG. 11 depicts a timing chart illustrating operations of the image sensor. G1 to G4 in the figure indicate the electric potential of respective gate lines, and RST indicates an action of the reset switch 923 of the integrating circuit. The reset switch is conductive when the RST is at its high-level. Out_1 to Out_4 indicate the outputs of the signal readout circuit 920. Out_1 is an output of the integrating circuit connected to the data line D1. Similarly, Out_2, Out_3, and Out_4 are outputs of the integrating circuit connected to the data line D2, the data line D3, and the data line D4, respectively.

First, reverse bias is applied to the photoelectric transducers 912 of all the pixels. Thereafter, the image sensor is irradiated with X-rays during a time period Tx. Then, the phosphor layer of the image sensor converts the X-rays into light, and electric charges stored in each photoelectric transducer 912 is reduced according to the amount of light. A pulse is applied to the gate lines sequentially after a certain time period. Time period T1 is a time period during which a pulse is applied to the gate line G1, and thus the TFTs in a pixel row connected to the gate line G1 become a conductive state, and electric current flows into the data lines D1 to D4 in directions that make electric charges that have been reduced in the corresponding photoelectric transducers 912 be recharged. Signals corresponding to the irradiation amount of the X-rays are obtained by integrating such electric current with the integrating circuit. After the integration of the signals has ended, the reset switch of the integrating circuit is set to a conductive state according to the signal RST and electric charge stored in the integral capacity is reset. It is possible to obtain a two-dimensional X-ray image by performing the above operations to all the gate lines.

Example 7

Figure 12:
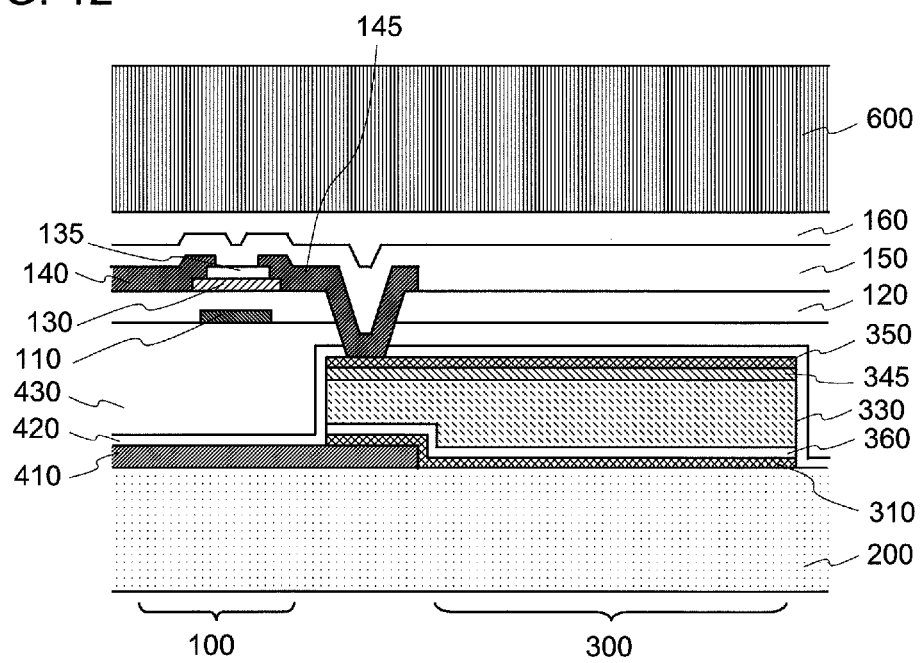
FIG. 12 is a cross-sectional view illustrating a structure of an image sensor according to EXAMPLE 7.
Figure 13:
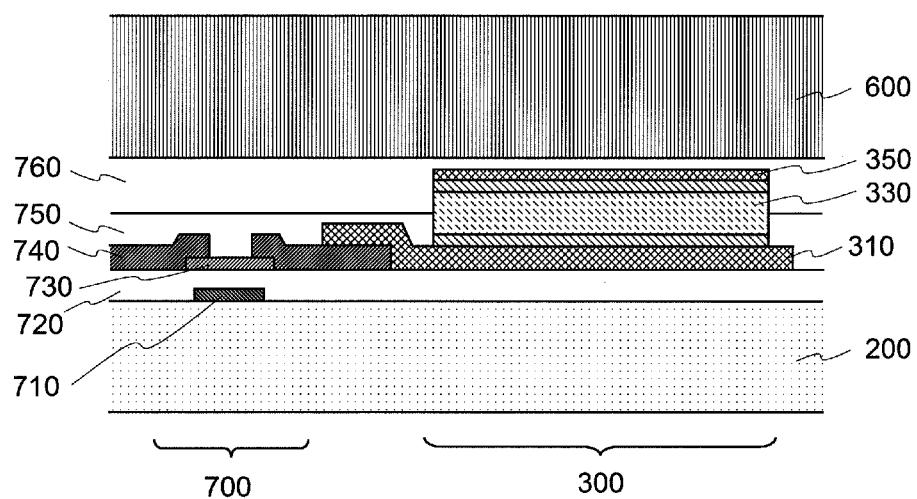
FIG. 13 is a cross-sectional view illustrating a structure of a conventional image sensor.
Figure 14:
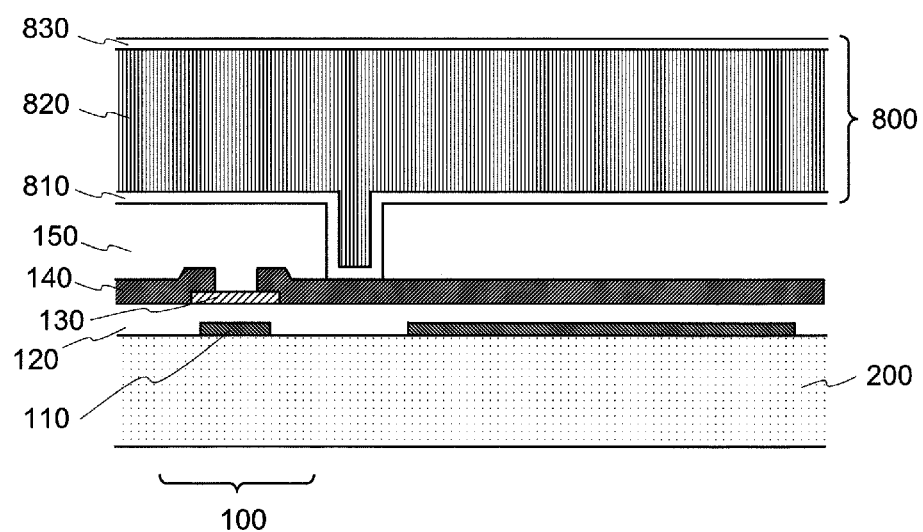
FIG. 14 is a cross-sectional view illustrating a structure of a conventional image sensor.

FIG. 12 depicts a structure of another example of the image sensor according to EMBODIMENT 2. This structure is the same as the structure shown in EXAMPLE 3 except the structure of each photoelectric transducers 300. In this example, each photoelectric transducer 300 is constituted by a lower electrode 310, an insulating layer 360, an i-a-Si:H layer 330, an n-a-SiC:H layer 345, and an upper electrode 350. Here, each photoelectric transducer has a structure called an MIS (metal insulating layer-semiconductor) diode. Here, for example, the lower electrode 310 can be made of Cr or Al, and the upper electrode 350 can be a transparent electrode made of, for example, ITO.

According to this example, as in EXAMPLE 3, it is possible to make the image sensor achieve an increased resolution and support fluoroscopy (taking moving or real-time images), improve the yield, improve the spatial resolution of the image sensor, and reduce the manufacturing cost.

The reason is the same as the reason described in EXAMPLE 3. Further, in this structure, the semiconductor layers of each photoelectric transducers can be prepared with only an intrinsic semiconductor layer and a p type or an n type semiconductor layer. That is, as in p-i-n diodes, there is no need to introduce two kinds of impurity at the time of manufacture, and thus it is possible to simplify the manufacturing facility. However, in the MIS diode, it is necessary to apply forward bias to the diode to perform resetting when reading signals, and thus the signal read-out speed is somewhat slow.

It should be noted that the present invention is not limited to the above-described embodiments and examples, and the structure and the manufacturing method of the image sensor can be modified as appropriate as long as the gist of the present invention is not deviated.

For example, although SiC, $Al_2O_3$, $Y_2O_3$ and AlN are cited as possible material of the blocking layer in the above, the blocking layer need only include material having a function of suppressing the penetration of hydrogen.

In addition, in the above, there were shown a structure including photoelectric transducers of a-Si:H and a blocking layer arranged between the photoelectric transducers and the switching elements, and another type of structure that at least the top layer of the semiconductor layers in each photoelectric transducer works as a blocking layer. Alternatively, by combining these structures, there can be provided another structure that another blocking layer is further arranged between the switching elements and the photoelectric transducers each including the semiconductor layers in which at least the top layer works as a blocking layer. By preparing plural blocking layers it is possible to further improve the function of suppressing the penetration of hydrogen in the image sensor.

In addition, in the above, the thickness of each component member of the image sensor has not been limited in particular. However, the thickness of each component member can be set to any value that allows the resulting sensor to work properly as an image sensor (as for the blocking layer, any value that allows the blocking layer to efficiently suppress penetration of hydrogen). In addition, in the above, there is no description of a manufacturing apparatus to be used for forming each component member of the image sensor. However, for example, a sputtering apparatus, a vacuum evaporation apparatus, a CVD (Chemical Vapor Deposition) apparatus, a PVD (Physical Vapor Deposition) apparatus, an RIE (Reactive Ion Etching) apparatus, and an ion injection apparatus, can be used as the manufacturing apparatus as appropriate.

The invention claimed is:

1. An image sensor comprising:
a substrate;
photoelectric transducers on the substrate, each of the photoelectric transducers including a hydrogenated amorphous silicon layer; and
switching elements above the photoelectric transducers, each of the switching elements including an amorphous oxide semiconductor layer,
wherein each of the photoelectric transducers is configured to convert light entering from a side of the switching element to an electric charge, and includes a hydrogenated amorphous silicon carbide layer laminated on a top of the hydrogenated amorphous silicon layer of the photoelectric transducer, the hydrogenated amorphous silicon carbide layer having a function to suppress penetration of hydrogen separated from the hydrogenated amorphous silicon layer into the switching element.

2. The image sensor of claim 1, wherein
each of the photoelectric transducers further includes a hydrogenated amorphous silicon carbide layer laminated on a bottom of the hydrogenated amorphous silicon layer.

3. The image sensor of claim 1, further comprising a plurality of pixels arranged in matrix, wherein
the hydrogenated amorphous silicon layers of the photoelectric transducers form a layer being continuous over the plurality of pixels, and
in each of the plurality of pixels, the hydrogenated amorphous silicon carbide layer on the top of the hydrogenated amorphous silicon layer and an upper electrode of the photoelectric transducer are isolated from the hydrogenated amorphous silicon carbide layers on the top of the hydrogenated amorphous silicon layers and upper electrodes of the photoelectric transducers in the other pixels.

* * * * *